United States Patent
Simin et al.

(10) Patent No.: US 8,878,154 B2
(45) Date of Patent: Nov. 4, 2014

(54) SEMICONDUCTOR DEVICE WITH MULTIPLE SPACE-CHARGE CONTROL ELECTRODES

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 30 days.

(21) Appl. No.: 13/682,587

(22) Filed: Nov. 20, 2012

(65) Prior Publication Data
US 2013/0127521 A1    May 23, 2013

Related U.S. Application Data

(60) Provisional application No. 61/561,980, filed on Nov. 21, 2011.

(51) Int. Cl.
*H01L 29/02* (2006.01)
*G05F 3/02* (2006.01)

(52) U.S. Cl.
CPC ........................ *G05F 3/02* (2013.01)
USPC ..... 257/2; 257/3; 257/4; 257/5; 257/E29.002; 438/102; 438/103; 438/104

(58) Field of Classification Search
CPC ..................................................... H01L 45/04
USPC .................. 257/2–5, E29.002; 438/102–104
See application file for complete search history.

(56) References Cited

U.S. PATENT DOCUMENTS

2010/0156475 A1*    6/2010    Simin et al. .................. 327/109

OTHER PUBLICATIONS

Saito et al., Theoretical limit estimation of lateral wide band-gap semiconductor power-switching device, Solid-State Electronics, 2004, pp. 1555-1562, Elsevier.
Feiler et al., Multistep Field Plates for High-Voltage Planar p-n. Junctions, IEEE Transactions on Electron Devices, Jun. 1992, pp. 1514-1520, vol. 39 No. 6, IEEE.
Karmalkar et al., Enhancement of Breakdown Voltage in AlGaN/ GaN High Electron Mobility Transistors Using a Field Plate, IEEE Transactions on Electron Devices, Aug. 2001, pp. 1515-1521, vol. 48 No. 8., IEEE.

* cited by examiner

*Primary Examiner* — Jami M Valentine
(74) *Attorney, Agent, or Firm* — LaBatt, LLC

(57) ABSTRACT

A circuit including a semiconductor device having a set of space-charge control electrodes is provided. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal.

20 Claims, 10 Drawing Sheets

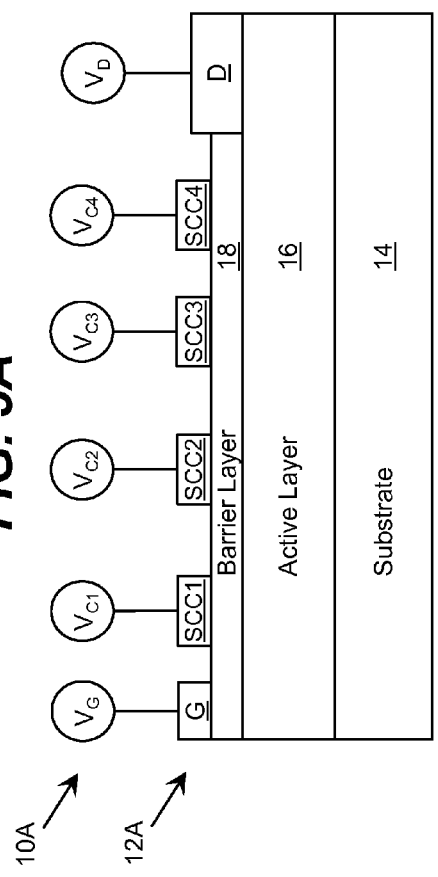
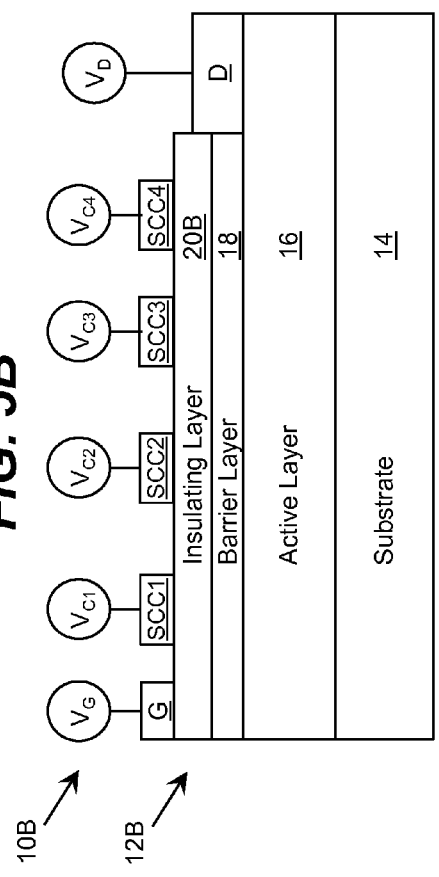
FIG. 5A
FIG. 5B

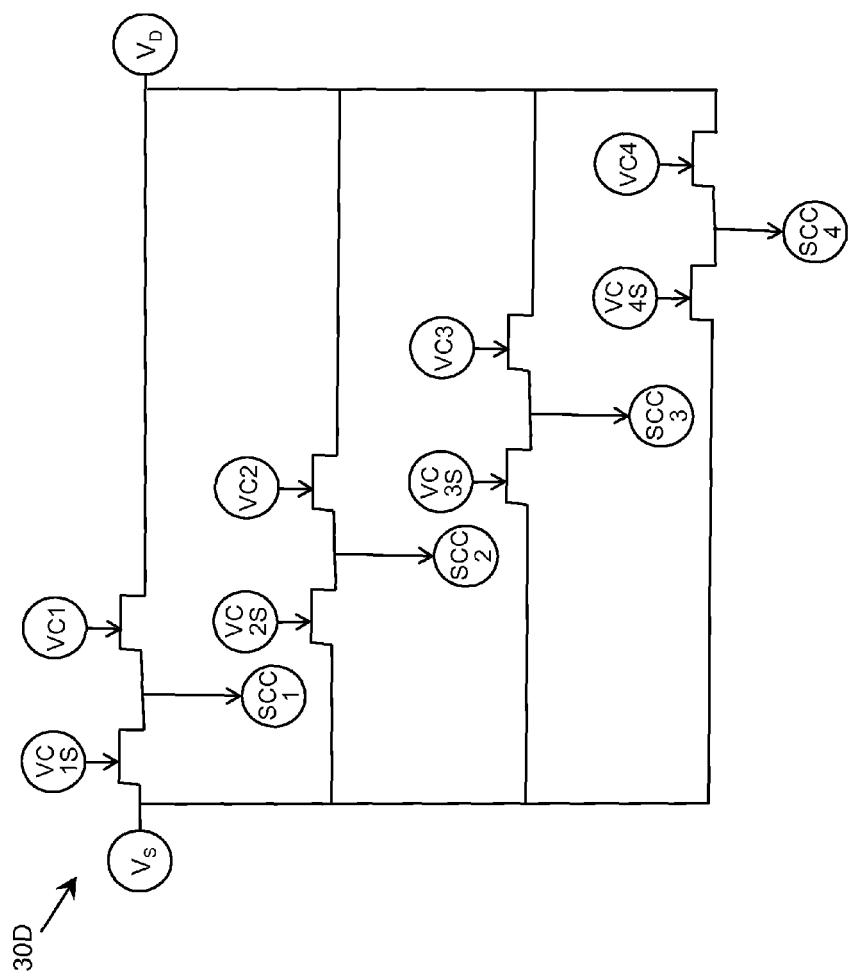

SEMICONDUCTOR DEVICE WITH MULTIPLE SPACE-CHARGE CONTROL ELECTRODES

REFERENCE TO RELATED APPLICATIONS

The current application claims the benefit of U.S. Provisional Application No. 61/561,980, titled "Semiconductor Device with Multiple Space-Charge Control Electrodes," which was filed on 21 Nov. 2011, and which is hereby incorporated by reference.

TECHNICAL FIELD

The disclosure relates generally to semiconductor devices, and more particularly, to a semiconductor device with multiple space-charge control electrodes.

BACKGROUND ART

In power semiconductor devices, achieving the highest breakdown voltage simultaneously with minimal on-resistance is one of the most important performance characteristics. Lateral geometry devices, such as field-effect transistors (FETs), including metal oxide semiconductor FETs (MOSFETs), metal semiconductor FETs (MESFETs), high electron mobility transistors (HEMTs), etc., have a channel aligned along the semiconductor surface, and which is often located close to the semiconductor surface. If the space-charge (depletion) region occupies only a portion of the gate-drain spacing, the electric field in that spacing is strongly non-uniform and can result in premature breakdown, which limits the device performance. Due to a high carrier concentration in the channel and the close vicinity of the channel to the semiconductor surface, efficient control over the space charge distribution in the gate-drain spacing is extremely challenging.

FIG. 1 shows a conventional heterostructure FET (HFET) 2 according to the prior art, and FIG. 2 shows an illustrative electric field distribution chart according to the prior art. As illustrated in FIG. 2, the electric field profile in the gate-drain spacing having a distance, $L_{GD}$, shown in FIG. 1 exhibits a strong peak near the gate edge when the HFET 2 is operated as a switch (without field plate). The peak width is defined by the carrier concentration in the channel. To this extent, a breakdown voltage for the HFET 2 does not increase when the gate-drain spacing distance $L_{GD}$ is increased.

One approach to lower the peak electric field near the gate edge is the use of one or more field-modulating plates (FPs), which can be connected to either the gate, source, or drain electrode. FIG. 2 illustrates an illustrative field plate connected to a gate and the resulting electric field distribution. A multistep field plate structure is shown in FIG. 3, and a gradual field plate structure is shown in FIG. 4. In each case, the field plate structure decreases the peak field near the gate electrode edge by splitting it into two or more peaks, thereby increasing the breakdown voltage for the device. However, even multiple field plate structures cannot achieve a uniform electric field in the device channel.

Additionally, optimal configuration of multiple field plates is difficult to achieve. For example, the optimal configuration requires precisely controlled field plate length and dielectric thickness variation along the channel. In addition, prior art field plates have either source or gate potential applied to them, and therefore significant voltage exists between the field plate and the drain electrode. As a result, a device including field plate(s) can suffer from premature breakdown between the field plate(s) and the drain electrode. Furthermore, the field plate(s) increases the inter-electrode and electrode-semiconductor capacitances and therefore decreases the device maximum operating frequency.

As a result of the above limitations, current high-voltage FET switches (i) do not achieve the breakdown voltages predicted by fundamental material properties and (ii) exhibit breakdown voltage-gate-drain spacing dependence saturating at high voltages, typically four hundred volts and above, which imposes serious limitations on device design for kilovolt switching applications.

SUMMARY OF THE INVENTION

Aspects of the invention provide a circuit including a semiconductor device having a set of space-charge control electrodes. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal.

A first aspect of the invention provides a circuit comprising: a semiconductor device including: a semiconductor structure including a channel; a first terminal and a second terminal to the channel; and a set of space-charge control electrodes located between the first terminal and the second terminal on a surface of the semiconductor structure; and a biasing network supplying an individual bias voltage to each of the set of space-charge control electrodes, wherein the bias voltage for each of the set of space-charge control electrodes is selected based on a bias voltage of the first terminal, a bias voltage of the second terminal, and a location of the space-charge control electrode relative to the first terminal and the second terminal.

A second aspect of the invention provides a circuit comprising: a semiconductor device including: a semiconductor structure including a channel; a first terminal and a second terminal to the channel; and a set of space-charge control electrodes located between the first terminal and the second terminal on a surface of the semiconductor structure; and a biasing network supplying an individual bias voltage to each of the set of space-charge control electrodes, wherein the bias voltage for each of the set of space-charge control electrodes is configured to deplete a region of the channel under the corresponding space-charge control electrode at an operating voltage applied to the second terminal.

A third aspect of the invention provides a circuit comprising: a transistor including: a semiconductor structure including a channel; a gate and a drain; and a set of space-charge control electrodes located between the gate and the drain on a surface of the semiconductor structure; and a biasing network supplying an individual bias voltage to each of the set of space-charge control electrodes, wherein the bias voltage for each of the set of space-charge control electrodes is selected based on a bias voltage of the gate, a bias voltage of the drain, and a location of the space-charge control electrode relative to the gate and the drain.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 5A-5D show schematic structures of gate-drain regions of illustrative devices connected in circuits according to embodiments.

FIGS. 9A-9D show illustrative biasing networks according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
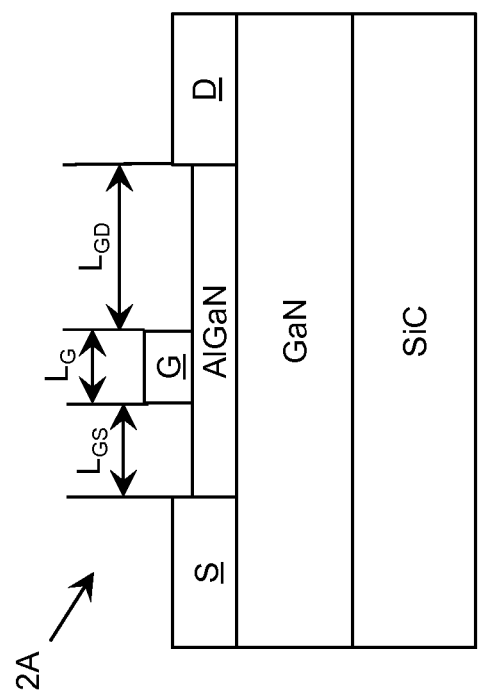
FIG. 1 shows a conventional heterostructure field effect transistor according to the prior art.
Figure 2:
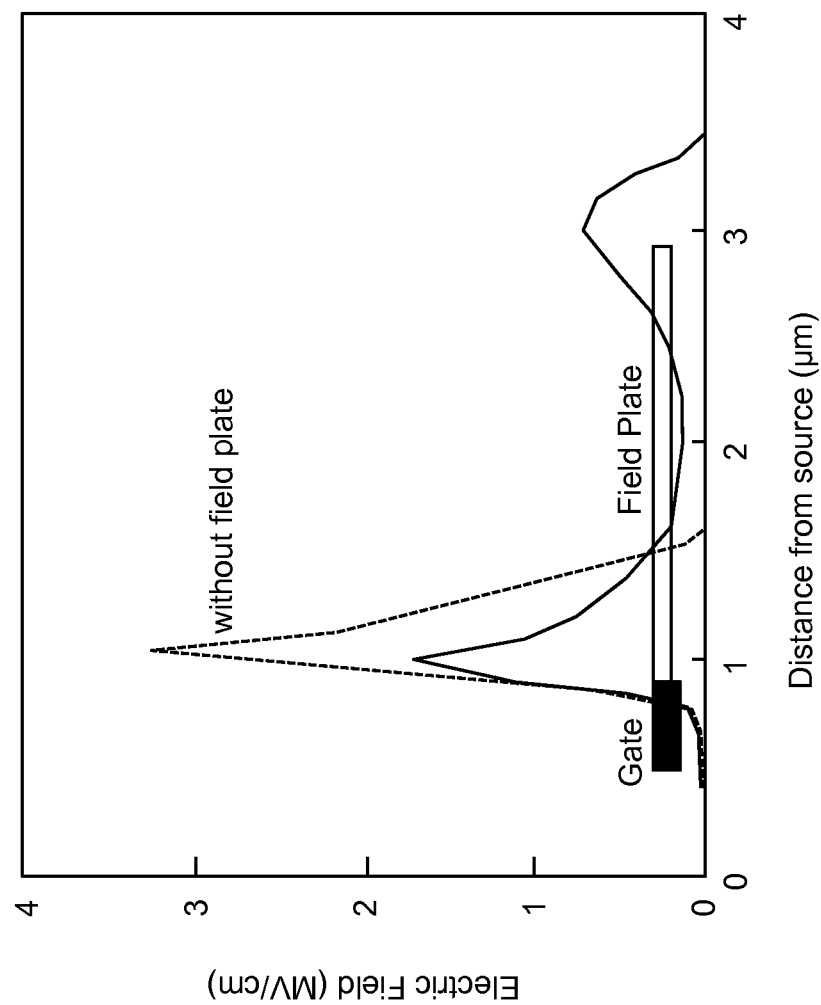
FIG. 2 shows an illustrative electric field distribution chart according to the prior art.
Figure 3:
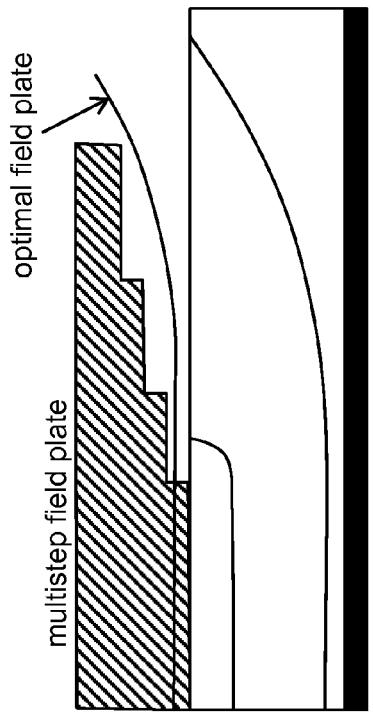
FIG. 3 shows a schematic structure of a multistep field plate according to the prior art.
Figure 4:
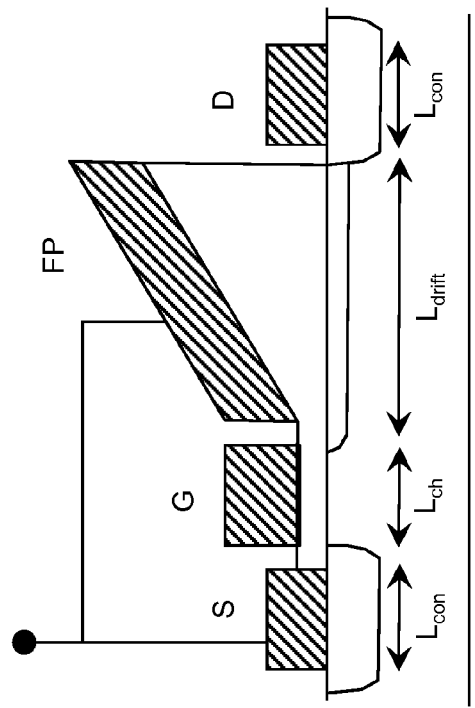
FIG. 4 shows a schematic structure of a gradual field plate according to the prior art.

As indicated above, aspects of the invention provide a circuit including a semiconductor device having a set of space-charge control electrodes. The set of space-charge control electrodes is located between a first terminal, such as a gate or a cathode, and a second terminal, such as a drain or an anode, of the device. The circuit includes a biasing network, which supplies an individual bias voltage to each of the set of space-charge control electrodes. The bias voltage for each space-charge control electrode can be: selected based on the bias voltages of each of the terminals and a location of the space-charge control electrode relative to the terminals and/or configured to deplete a region of the channel under the corresponding space-charge control electrode at an operating voltage applied to the second terminal. Aspects of the invention can provide a solution for increasing an operating voltage and/or a maximum power of the semiconductor device within the circuit. As used herein, unless otherwise noted, the term "set" means one or more (i.e., at least one) and the phrase "any solution" means any now known or later developed solution.

Turning to the drawings, FIGS. 5A-5D show schematic structures of gate-drain regions of illustrative devices 12A-12D connected in circuits 10A-10D according to embodiments. Each device 12A-12D is shown including a substrate 14, an active layer 16, a barrier layer 18, a gate G, and a drain D. A channel is formed at a junction of the active layer 16 and the barrier layer 18. While not shown for clarity, it is understood that a device 12A-12D can include various additional contacts (e.g., a source contact) and/or layers (e.g., an initiation layer and/or a buffer layer located between the substrate 14 and the active layer 16). Each device 12A-12D, and components thereof, can be manufactured and fabricated using any solution. In an embodiment, the substrate 14 is formed of silicon carbide (SiC), the active layer 16 is formed of gallium nitride (GaN), the barrier layer 18 is formed of aluminum gallium nitride (AlGaN), and the gate G and drain D are formed of metal.

However, it is understood that this is only illustrative of various possible devices. To this extent, the substrate 14 can be formed of any of various types of compound semiconductor or dielectric materials, including for example, sapphire, diamond, germanium (Ge), gallium nitride (GaN), silicon, SiC, gallium arsenic (GaAs), and/or the like. Furthermore, the substrate 14 can comprise a conducting and/or semiconducting substrate. Similarly, layers 16, 18 can be formed of any combination of various types of group III nitride materials comprising one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, InGaN, AlGaInN, AlGaBN, AlInBN, and AlGaInBN with any molar fraction of group III elements. Furthermore, it is understood that the device 12A-12D can be formed from other types of semiconductor materials, including other types of group III-V materials, such as such as GaAs, GaAlAs, InGaAs, indium phosphorus (InP), and/or the like. Regardless, one or more of the layers in a heterostructure described herein can include one or more attributes to alleviate strain. For example, a layer can be formed of a superlattice structure.

Additionally, each device 12A-12D is shown including a set of space-charge control electrodes SCC1-SCC4 located on a surface of the semiconductor device 12A-12D between the gate G and the drain D. It is understood that while each device 12A-12D is shown including three or four electrodes SCC1-SCC4, a device can include any number of one or more electrodes SCC1-SCC4. When multiple electrodes SCC1-SCC4 are included, the electrodes SCC1-SCC4 can be spaced uniformly or non-uniformly within the region between the gate G and the drain D. Regardless, each electrode SCC1-SCC4 can be fabricated using any solution and can be formed of any type of material, such as a metal.

Figure 5C:
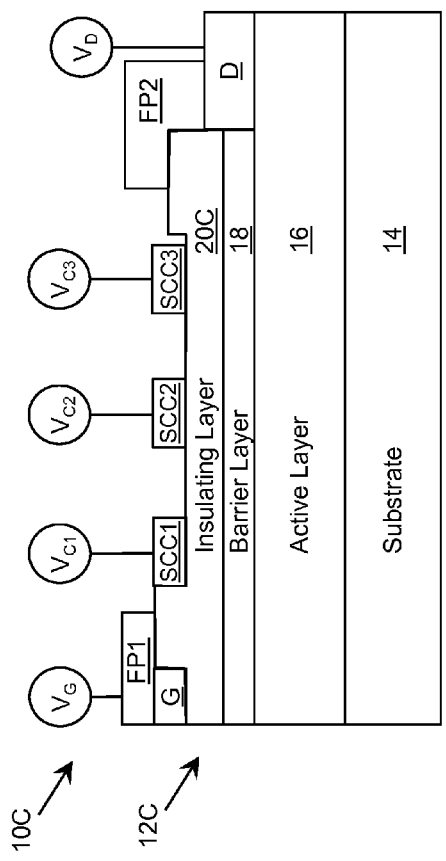
Figure 5D:
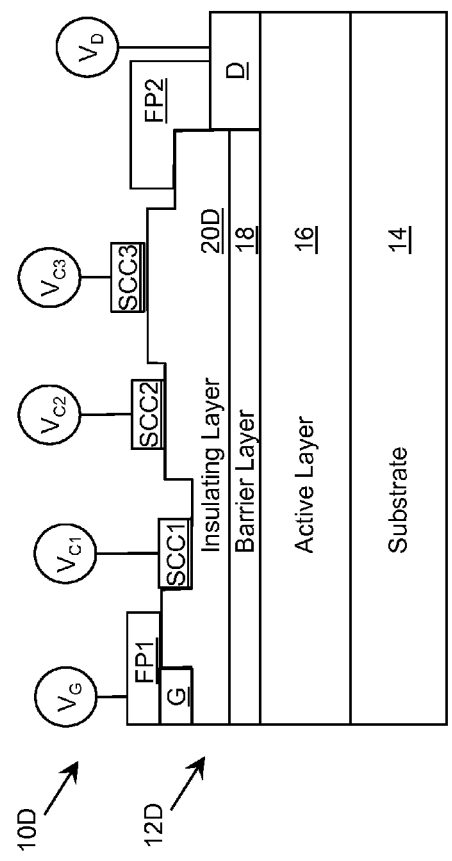

The gate G and/or one or more of the electrodes SCC1-SCC4 can form any type of contact to the surface of the semiconductor, such as a Schottky contact (shown in FIG. 5A), a metal-oxide-semiconductor (MOS) contact, a metal-insulator-semiconductor (MIS) contact, and/or the like, to the semiconductor surface. To this extent, the devices 12B-12D of FIGS. 5B-5D are shown including insulating layers 20B-20D located between the barrier layer 18 and the gate G and the electrodes SCC1-SCC4. The insulating layers 20B-20D can reduce an amount of leakage current associated with the gate G and the electrodes SCC1-SCC4. The insulating layers 20B-20D can be formed of any type of insulating material, such as silicon dioxide ($SiO_2$), silicon nitride ($Si_3N_4$), hafnium oxide ($HfO_2$), aluminum oxide ($Al_2O_3$), and/or the like. While each insulating layer 20B-20D is shown extending across the entire region from under the gate G to the drain D, it is understood that a device can include an insulating layer that only extends under any combination of one or more of the gate G and/or the electrodes SCC1-SCC4.

Furthermore, a device can include one or more field plates. To this extent, the devices 12C, 12D are shown including a pair of field plates FP1, FP2. Field plate FP1 is connected to the gate G and extends toward the drain D, while field plate FP2 is connected to the drain D and extends toward the gate G. It is understood that the field plates FP1, FP2 are only illustrative. To this extent, a device can include any number of zero or more field plates connected to the source, the drain D, and/or the gate G. Furthermore, it is understood that one or more of the electrodes SCC1-SCC4 can be a Schottky electrode.

As illustrated, the insulating layer 20C of the device 12C can have a different thickness in the regions on which the field plates FP1, FP2 are located. Similarly, as shown in conjunction with the device 12D, the insulating layer 20 can have a varying thickness for each of the electrodes SCC1-SCC3 and/or the gate G. In this case, a voltage applied to an electrode on a thicker portion of the insulating layer 20, such as the electrode SCC3, will have less effect on the electric field at the channel than a similar voltage applied to an electrode on a thinner portion of the insulating layer 20, such as the electrode SCC1. While the insulating layer 20 is shown having an increasing thickness going in a gate G to drain D direction, it is understood that this is only illustrative and any configuration of varying thicknesses of an insulating layer for the gate and/or electrodes located thereon can be utilized. For example, a thickness of the insulating layer 20 can decrease in thickness going in a gate G to drain D direction.

When a device 12A-12D is implemented in a circuit 10A-10D, the circuit 10A-10D can include components that apply an individual voltage bias $V_{C1}$-$V_{C4}$ to each of the electrodes SCC1-SCC4, respectively. In this case, individually biased electrodes SCC1-SCC4 can provide independent control of a potential difference between a corresponding portion of the channel located under the electrode SCC1-SCC4 and the drain D. In an embodiment, the voltage $V_{C1}$-$V_{C4}$ applied to each electrode SCC1-SCC4 is sufficiently high to deplete the portion of the channel located below the corresponding electrode SCC1-SCC4. Furthermore, the voltage $V_{C1}$-$V_{C4}$ applied to each electrode SCC1-SCC4 is significantly below (e.g., by at least 30%) a breakdown voltage between the electrode SCC1-SCC4, the gate G, the drain D, and the other electrodes SCC1-SCC4. In this case, the electrodes SCC1-SCC4 can reduce premature breakdown, which can occur between the field plate(s) and the drain electrode of prior art devices, since the voltages between the electrodes SCC1-SCC4 and the other electrodes are much lower than the breakdown voltage.

During operation of the device 12A-12D within the circuit 10A-10D, the voltages $V_{C1}$-$V_{C4}$ applied to each electrode SCC1-SCC4 can be configured to provide any target space-charge (electric field) profile in the spacing between the gate G and the drain D. Furthermore, the electrodes SCC1-SCC4 can be used to achieve any target (e.g., required) degree of depletion and/or space-charge region extension within the spacing between the gate G and the drain D. In an embodiment, the space-charge profile is configured to provide an increased (e.g., maximal) breakdown voltage for the device 12A-12D over other approaches.

Figure 6:
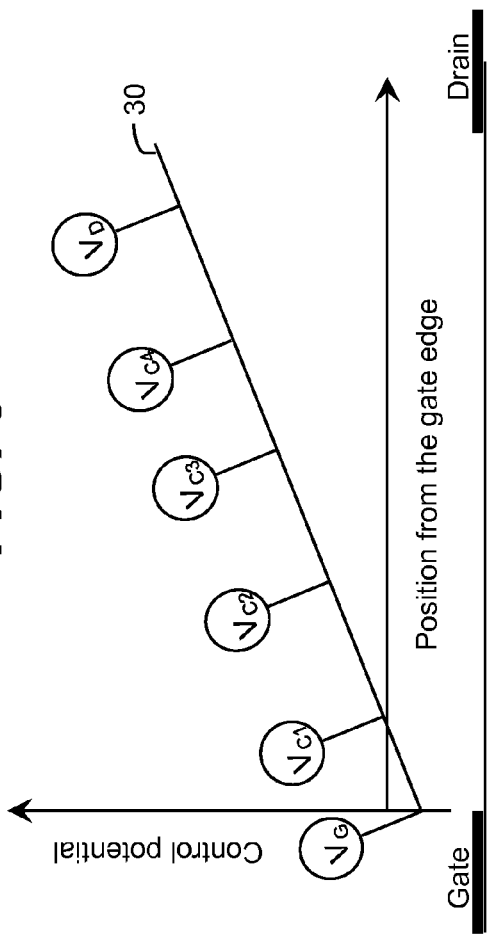
FIG. 6 shows an illustrative schematic voltage biasing diagram according to an embodiment.

The voltage $V_{C1}$-$V_{C4}$ applied to each electrode SCC1-SCC4 can be selected based on a location of the electrode SCC1-SCC4 relative to the gate G and the drain D, the gate voltage bias $V_G$, and/or the drain voltage $V_D$. For example, FIG. 6 shows an illustrative schematic voltage biasing diagram according to an embodiment. In this case, a linear function 30 can be calculated using a linear interpolation between two points in a plot of a distance between adjacent edges of the gate G and the drain D versus a difference between the gate voltage bias $V_G$ and the drain voltage $V_D$. Each voltage $V_{C1}$-$V_{C4}$ can be calculated using the linear function and a location of the corresponding electrode SCC1-SCC4 (e.g., a gate-side edge of the electrode) from a drain-side edge of the gate G. Alternatively, it is understood that a target location of an electrode SCC1-SCC4 can be calculated using the linear function and a corresponding voltage $V_{C1}$-$V_{C4}$ to be applied to the electrode SCC1-SCC4. Furthermore, it is understood that each voltage $V_{C1}$-$V_{C4}$ also can be calculated based on one or more additional factors. For example, when a device includes an insulating layer having a varying thickness, such as the insulating layer 20D (FIG. 5D), the corresponding voltage $V_{C1}$-$V_{C4}$ to be applied to each electrode SCC1-SCC3 (FIG. 5D) can be further based on the corresponding thickness of the insulating layer 20D. To this extent, the varying thickness of an insulating layer can be used to adjust (e.g., reduce) a difference in the voltages applied to the corresponding electrodes from that which would be otherwise required to have a desired effect on the electric field, such as those voltages calculated using the linear function 30.

Figure 7:
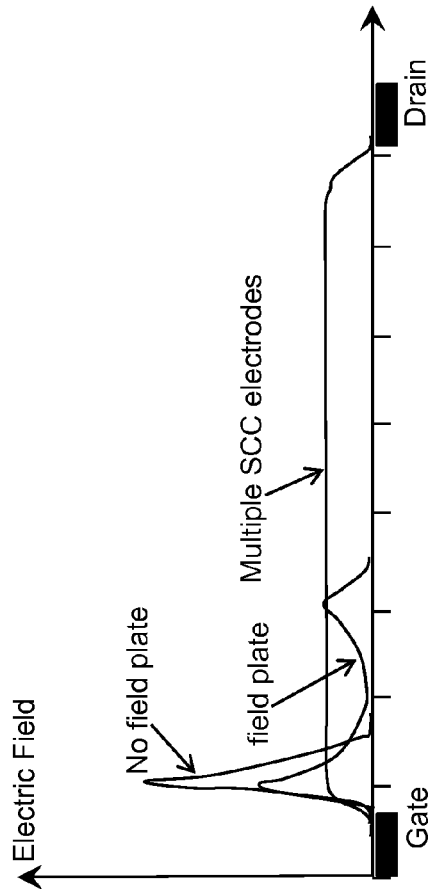
FIG. 7 shows an illustrative comparison of qualitative electric field profiles according to an embodiment.

As described herein, the electrodes SCC1-SCC4 can be operated to provide improved control over the electric field within the spacing between the gate G and the drain D of a device 12A-12D. To this extent, FIG. 7 shows an illustrative comparison of qualitative electric field profiles according to an embodiment. As illustrated for a FET, such as FET 2A (FIG. 1), the electric field exhibits a strong peak near the gate edge. Using a field plate, the electric field peak near the gate can be reduced by splitting the electric field into two or more peaks. However, using the electrodes SCC1-SCC4 and corresponding circuit described herein, the electric field distribution can be substantially uniform between the gate G and the drain D.

It is understood that the various device configurations shown herein are only illustrative of numerous device configurations possible. To this extent, a device can include more or fewer layers having any of various configurations. For example, a device can include an isolation layer and/or a passivation layer over some or all of the surface of the structure. Additionally, it is understood that the space-charge control electrodes SCC1-SCC4 described herein can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like.

Figure 8:
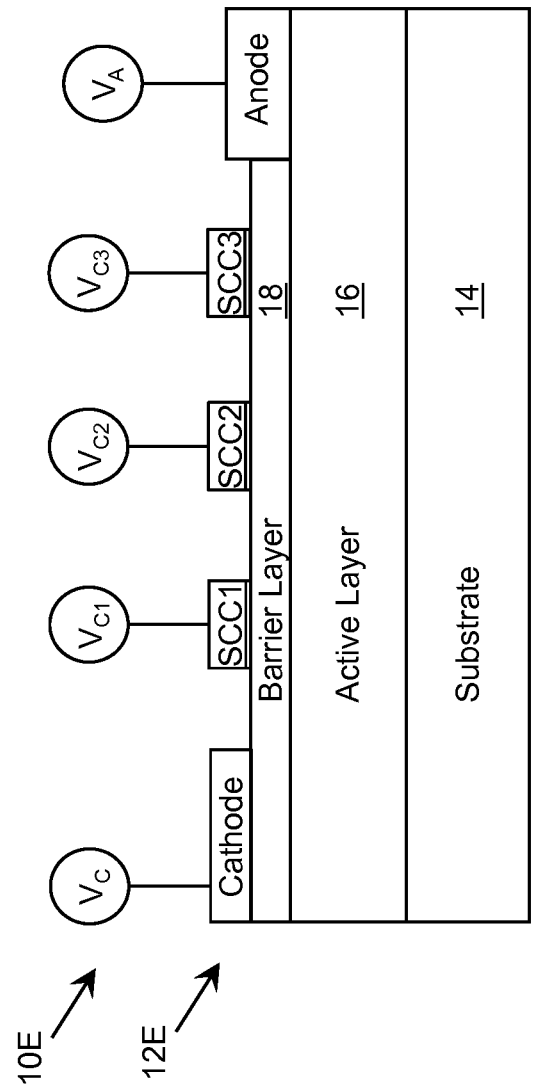
FIG. 8 shows a schematic structure of an illustrative diode connected in a circuit according to an embodiment.

Furthermore, the space-charge control electrodes can be implemented in other types of semiconductor devices, including for example, a diode of any type, a semiconductor resistor, a semiconductor sensor, a light emitting diode, a laser, an integrated element, and/or the like. To this extent, FIG. 8 shows a schematic structure of an illustrative diode 12E connected in a circuit 10E according to an embodiment. As illustrated, the diode 12E includes three electrodes SCC1-SCC3 located in the spacing between the cathode and the anode. During operation of the diode 12E in the circuit 10E, the circuit 10E can include components to bias the electrodes SCC1-SCC3 as described herein.

Figure 9A:
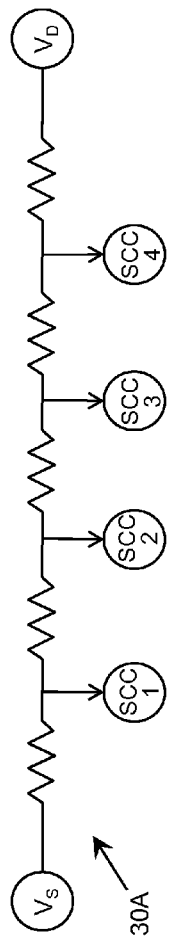

As discussed herein, a circuit can include components that individually bias each of the space-charge control electrodes. To this extent, FIGS. 9A-9D show illustrative biasing networks 30A-30D according to embodiments. In FIG. 9A, the biases are provided using a resistive divider type of biasing network 30A with the divider connected between the source, $V_S$, and drain, $V_D$, electrodes. In this case, a resistive component is located between each of the source voltage $V_S$, the voltage sources for each of the electrodes SCC1-SCC4, and the drain voltage $V_D$, thereby providing a unique voltage to each of the electrodes SCC1-SCC4.

The resistance values can be selected to ensure the source-drain leakage current does not exceed a maximum allowed value. For example, for a maximum off-state current, $I_{OFFMAX}$, and a maximum drain bias, $V_{DMAX}$, a total resistance of the biasing network 30A, $R_{DIV}$, should meet the condition $R_{DIV} > V_{DMAX}/I_{OFFMAX}$. An individual resistance value for each of the resistive components in the biasing network 30A can be selected based on the corresponding locations of the electrodes, e.g., using the linear function shown in FIG. 6.

Figure 9B:
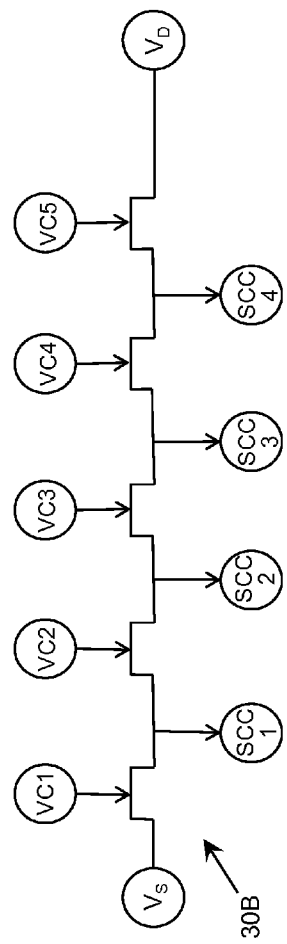
Figure 9C:
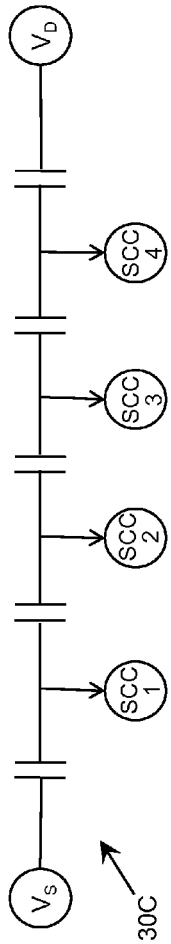

Alternatively, the biasing network can be formed using nonlinear elements, such as transistors of any type, diodes, or the like. For example, FIG. 9B shows a biasing network 30B formed by an active voltage controlled voltage divider using a series of transistors, e.g., field effect transistors or bipolar junction transistors. In this case, each of the transistors can be controlled using a unique voltage control, VC1-VC5, thereby providing individual control over the biases provided to the space-charge control electrodes. In FIG. 9C, the biasing network 30C is formed using a capacitive divider. In this configuration, an amount of additional leakage current associated with the biasing network 30C can be reduced. In FIG. 9D, the biasing network 30D is formed by a parallel connection of biasing elements or any other type of circuitry delivering individual and independent biases to the space-charge control electrodes. In this case, the voltage bias for each space-charge control electrode (SCC1-SCC4) is provided using a pair of individually controlled transistors. It is understood that the biasing networks 30A-30D are only illustrative of various analog or digital electronic circuits that can be utilized to provide the target biasing to each space-charge control electrode.

It is understood that the various semiconductor devices described herein can be manufactured using any solution. For example, a device heterostructure can be formed using any solution, e.g., by obtaining (e.g., forming, preparing, acquiring, and/or the like) a substrate 14, forming (e.g., growing, depositing, adhering, and/or the like) an initiation layer and/or a buffer layer thereon, forming an active layer 16 thereon, and forming a barrier layer 18 on the active layer 16. Additionally, metal electrode(s), dielectric layer(s), and/or the like, can be formed on the device heterostructure using any solution. Furthermore, as described herein, the manufacture of the device can include the formation of one or more space-charge control electrodes using any solution. It is understood that the manufacture of a device described herein can include additional processing, including for example: the deposition and removal of a temporary layer, such as mask layer; the patterning one or more layers; the formation of one or more additional layers/contacts not shown; application to a submount (e.g., via contact pads); and/or the like.

Similarly, it is understood that the various circuits described herein can be manufactured using any solution. For example, one or more of the space-charge control electrodes of a device can include connectors for applying an external bias or other signal to the corresponding space-charge control electrode(s). Furthermore, the biasing network can comprise a built-in biasing network. The circuit also can be formed of a series of discrete components, a monolithic integrated circuit, or a hybrid circuit. Additionally, while each space-charge control electrode is shown and described as being individually controlled, it is understood that the circuit can provide a required bias to a group of two or more space-charge control electrodes that are connected to each other.

While shown and described herein as a method of designing and/or fabricating a semiconductor device and/or circuit, it is understood that aspects of the invention further provide various alternative embodiments. For example, in one embodiment, the invention provides a method of designing and/or fabricating a circuit that includes one or more of the semiconductor devices designed and fabricated as described herein.

Figure 10:
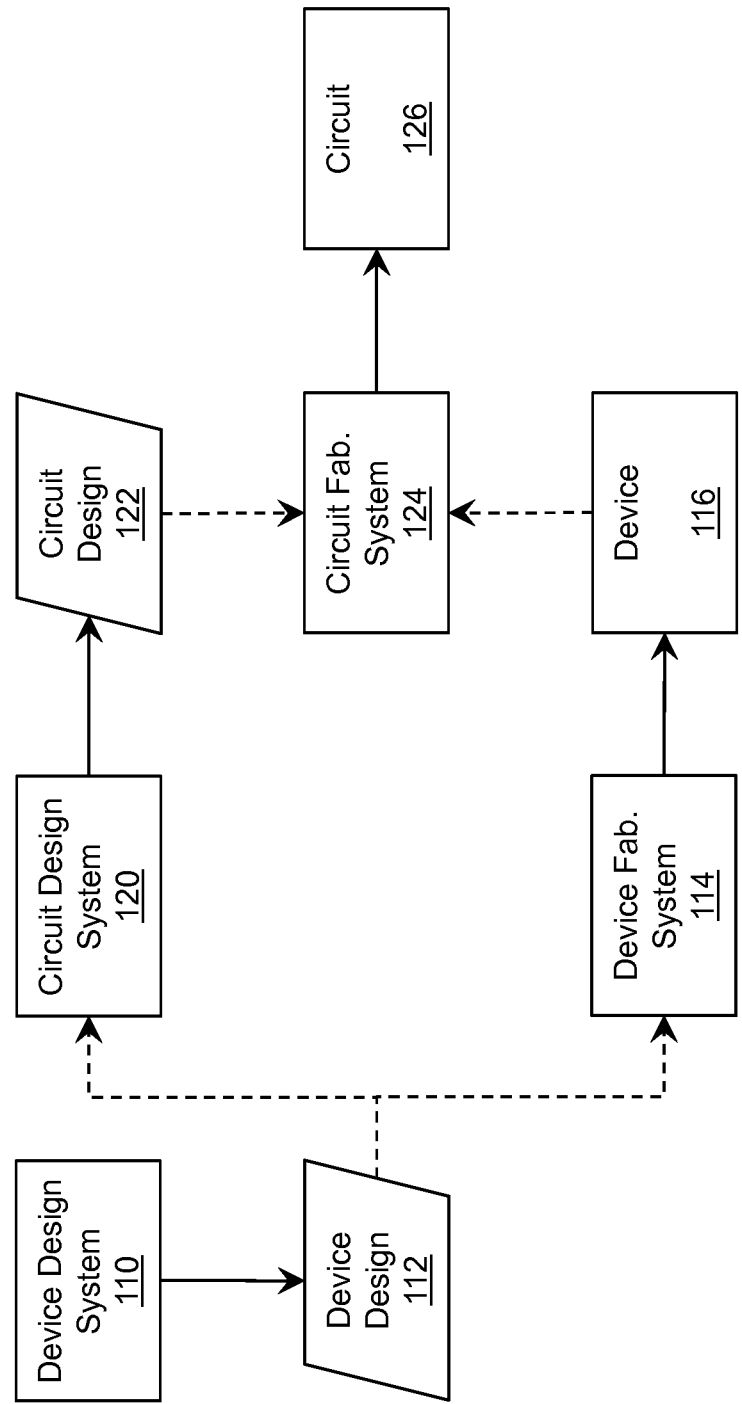
FIG. 10 shows an illustrative flow diagram for fabricating a circuit according to an embodiment.

To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A circuit comprising:
   a semiconductor device including:
      a semiconductor structure including a channel;
      a first terminal and a second terminal to the channel;
      at least one field plate connected to one of: the first terminal or the second terminal;
      a set of space-charge control electrodes located between the first terminal and the second terminal on a surface of the semiconductor structure; and
   a biasing network supplying an individual bias voltage to each of the set of space-charge control electrodes, wherein the bias voltage for each of the set of space-charge control electrodes is selected based on a bias voltage of the first terminal, a bias voltage of the second terminal, and a location of the space-charge control electrode relative to the first terminal and the second terminal.

2. The circuit of claim 1, wherein the bias voltage for each of the set of space-charge control electrodes is calculated using a linear function derived from the bias voltage of the first terminal, the bias voltage of the second terminal, and the distance between the first terminal and the second terminal.

3. The circuit of claim 1, wherein the bias voltage for each of the set of space-charge control electrodes is configured to deplete a region of the channel under the corresponding space-charge control electrode at an operating voltage applied to the second terminal.

4. The circuit of claim 1, wherein the semiconductor device is configured to operate as a field-effect transistor, and wherein the first terminal is a gate and the second terminal is a drain.

5. The circuit of claim 1, wherein the semiconductor device is configured to operate as a diode, and wherein the first terminal is a cathode and a second terminal is an anode.

6. The circuit of claim 1, wherein the semiconductor device further includes an insulating layer located between at least one of the set of space-charge control electrodes and the semiconductor structure.

7. The circuit of claim 6, wherein the set of space-charge control electrodes includes a plurality of space-charge control electrodes and wherein the insulating layer has a different thickness for each of the plurality of space-charge control electrodes 8. The circuit of claim 1, wherein the semiconductor structure is formed of one of: silicon, silicon carbide, or a group III-V material.

9. The circuit of claim 1, wherein the semiconductor structure is formed of a group III nitride material.

10. A circuit comprising:
    a semiconductor device including:
       a semiconductor structure including a channel;
       a first terminal and a second terminal to the channel;
       a plurality of space-charge control electrodes located between the first terminal and the second terminal on a surface of the semiconductor structure; and
       an insulating layer located between at least one of the plurality of space-charge control electrodes and the semiconductor structure, wherein the insulating layer has a different thickness for each of the plurality of space-charge control electrodes; and
    a biasing network supplying an individual bias voltage to each of the plurality of space-charge control electrodes, wherein the bias voltage for each of the plurality of space-charge control electrodes is configured to deplete a region of the channel under the corresponding space-charge control electrode at an operating voltage applied to the second terminal.

11. The circuit of claim 10, wherein the bias voltage for each of the plurality of space-charge control electrodes is calculated using a linear function derived from the bias voltage of the first terminal, the bias voltage of the second terminal, and the distance between the first terminal and the second terminal.

12. The circuit of claim 10, wherein the semiconductor device is configured to operate as a field-effect transistor, and wherein the first terminal is a gate and the second terminal is a drain.

13. The circuit of claim 10, wherein the semiconductor device is configured to operate as a diode, and wherein the first terminal is a cathode and a second terminal is an anode.

14. The circuit of claim 10, wherein the semiconductor device further includes at least one field plate connected to one of: the first terminal or the second terminal.

15. A circuit comprising:
    a transistor including:
       a semiconductor structure including a channel;
       a gate and a drain; and
       a plurality of space-charge control electrodes located between the gate and the drain on a surface of the semiconductor structure; and
       an insulating layer located between at least one of the plurality of space-charge control electrodes and the semiconductor structure, wherein the insulating layer has a different thickness for each of the plurality of space-charge control electrodes; and
    a biasing network supplying an individual bias voltage to each of the plurality of space-charge control electrodes, wherein the bias voltage for each of the plurality of space-charge control electrodes is selected based on a bias voltage of the gate, a bias voltage of the drain, and a location of the space-charge control electrode relative to the gate and the drain.

16. The circuit of claim 15, wherein the bias voltage for each of the plurality of space-charge control electrodes is calculated using a linear function derived from the bias voltage of the gate, the bias voltage of the drain, and the distance between the gate and the drain.

17. The circuit of claim 15, wherein the bias voltage for each of the plurality of space-charge control electrodes is configured to deplete a region of the channel under the corresponding space-charge control electrode at an operating voltage applied to the drain.

18. The circuit of claim 10, wherein the bias voltage for each of the plurality of space-charge control electrodes is selected based on a bias voltage of the first terminal, a bias voltage of the second terminal, and a location of the space-charge control electrode relative to the first terminal and the second terminal.

19. The circuit of claim 10, wherein the semiconductor structure is formed of a group III nitride material.

20. The circuit of claim 15, wherein the transistor further includes at least one field plate connected to one of: the gate or the drain.

* * * * *